United States Patent
Sarode Vishwanath et al.

(10) Patent No.: US 11,569,114 B2
(45) Date of Patent: Jan. 31, 2023

(54) SEMICONDUCTOR PROCESSING WITH COOLED ELECTROSTATIC CHUCK

(71) Applicant: Applied Materials, Inc., Santa Clara, CA (US)

(72) Inventors: Yogananda Sarode Vishwanath, Bangalore (IN); Steven E. Babayan, Los Altos, CA (US); Andreas Schmid, Meyriez (CH); Stephen Donald Prouty, San Jose, CA (US); Andrew Antoine Noujaim, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 99 days.

(21) Appl. No.: 17/174,591

(22) Filed: Feb. 12, 2021

(65) Prior Publication Data
US 2022/0262664 A1 Aug. 18, 2022

(51) Int. Cl.
*B29C 65/00* (2006.01)
*H01L 21/683* (2006.01)
(Continued)

(52) U.S. Cl.
CPC ...... *H01L 21/6833* (2013.01); *H01L 21/6838* (2013.01); *H05K 7/20272* (2013.01);
(Continued)

(58) Field of Classification Search
CPC ..... H01L 21/6838; B29C 65/02; B29C 65/48; B29C 65/561
See application file for complete search history.

(56) References Cited

U.S. PATENT DOCUMENTS

| | | | |
|---|---|---|---|
| 2003/0164226 A1 | 9/2003 | Kanno et al. | |
| 2010/0039747 A1* | 2/2010 | Sansoni | H01L 21/67103 361/234 |

(Continued)

FOREIGN PATENT DOCUMENTS

| | | |
|---|---|---|
| JP | 2010-219354 A | 9/2010 |
| JP | 2020-150257 A | 9/2020 |

OTHER PUBLICATIONS

U.S. Appl. No. 16/997,300, First Named Inventor: Yogananda Sarode Vishwanath, Title: Cryogenic Electrostatic Chuck.

(Continued)

*Primary Examiner* — Philip C Tucker
*Assistant Examiner* — Nickolas R Harm
(74) *Attorney, Agent, or Firm* — Patterson + Sheridan, LLP (57) ABSTRACT

Embodiments described herein relate to a substrate support assembly. The substrate support assembly includes an ESC base assembly having a base channel disposed therein, a facility plate, the facility plate coupled to the ESC base assembly with a vacuum region therebetween, and a seal assembly. The seal assembly includes an upper flange coupled to the base channel of the ESC base assembly, the upper flange disposed in the facility plate, a lower flange coupled to the upper flange, the lower flange disposed in the facility plate, a gasket disposed between the upper flange and the lower flange, and an insulator tube coupled to the lower flange. A passage is connected to the base channel, the passage is defined by connected openings of the upper flange, the gasket, the lower flange, the insulator tube, and the base assembly.

20 Claims, 9 Drawing Sheets

(51) Int. Cl.
*H05K 7/20* (2006.01)
*B29C 65/56* (2006.01)
*B29C 65/02* (2006.01)
*B29C 65/48* (2006.01)

(52) U.S. Cl.
CPC .............. *B29C 65/02* (2013.01); *B29C 65/48* (2013.01); *B29C 65/561* (2013.01)

(56) References Cited

U.S. PATENT DOCUMENTS

| | | |
|---|---|---|
| 2014/0034239 A1 | 2/2014 | Yang et al. |
| 2017/0133245 A1* | 5/2017 | Iizuka ................ H01L 21/67069 |
| 2018/0350561 A1* | 12/2018 | Yamaguchi ......... C23C 16/4586 |
| 2021/0082730 A1 | 3/2021 | Sarode Vishwanath et al. |

OTHER PUBLICATIONS

PCT Written Opinion of the International Searching Authority for International Application No. PCT/US2022/012341 dated Apr. 28, 2022.

\* cited by examiner

SEMICONDUCTOR PROCESSING WITH COOLED ELECTROSTATIC CHUCK

BACKGROUND

Field

Embodiments of the present disclosure generally relate to semiconductor manufacturing and more particularly to a substrate support assembly enabling low temperature operation of an electrostatic chuck (ESC).

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development require processing at low temperatures, for example at temperatures less than −20 degrees Celsius. Dry reactive ion etching a substrate uniformly maintained at temperatures less than −20 degrees Celsius enables ions to bombard the upward facing surfaces of materials disposed on the substrate with decreased spontaneous etching so that trenches with smooth, vertical sidewalls are formed. Additionally, selectivity of etching one material versus another can be improved at the cryogenic temperature. For example, selectivity between silicon (Si) and silicon dioxide ($SiO_2$) increases exponentially as temperature is decreased.

Thus, there is a need for an improved substrate support assembly suitable for use at temperatures.

SUMMARY

In one embodiment, a substrate support assembly is provided. The substrate support assembly includes an electrostatic chuck (ESC) base assembly with the ESC base assembly having a base channel disposed therein, a facility plate, the facility plate coupled to the ESC base assembly with a vacuum region therebetween, and a seal assembly. The seal assembly includes an upper flange coupled to the base channel of the ESC base assembly, the upper flange disposed in the facility plate, a lower flange coupled to the upper flange, the lower flange disposed in the facility plate, a gasket disposed between the upper flange and the lower flange, and an insulator tube coupled to the lower flange. A passage is connected to the base channel, the passage is defined by connected openings of the upper flange, the gasket, the lower flange, the insulator tube, and the base assembly.

In another embodiment, a substrate support assembly is provided. The substrate support assembly includes an electrostatic chuck (ESC) base assembly with the ESC base assembly having a base channel disposed therein, a facility plate, the facility plate coupled to the ESC base assembly with a vacuum region therebetween, an insulator plate coupled to the facility plate, a ground plate coupled to the insulator plate, an interface assembly. The interface assembly includes an interface flange coupled to an insulator tube disposed through the insulator plate, the interface flange disposed in the ground plate, an outer ring disposed around the interface flange, a refrigerant flange coupled to the interface flange, and an interface gasket disposed between the interface flange and the refrigerant flange. A passage is connected to the base channel of the ESC base assembly defined by connected openings of the interface flange, the refrigerant flange, the interface gasket, and the base channel. A combined flange is coupled to the ground plate and the refrigerant flange disposed in the combined flange. A vacuum passage connected to the vacuum region. The vacuum passage is defined by an inner surface of the facility plate, an inner surface of the insulator plate, an inner surface of the ground plate, the interface flange, the outer ring, the refrigerant flange, the insulator tube, and the combined flange.

In yet embodiment, a substrate support assembly is provided. The substrate support assembly includes an electrostatic chuck (ESC) base assembly with the ESC base assembly having a base channel disposed therein, a facility plate, the facility plate coupled to the ESC base assembly with a vacuum region therebetween, and a refrigerant line coupled to a refrigerant flange disposed in a combined flange, the refrigerant line in fluid communication with a passage. The passage is connected to the base channel of the ESC base assembly. The passage defined by connected openings of the refrigerant flange and the base channel. A vacuum tube is coupled to the combined flange, the refrigerant line disposed in the vacuum tube, the vacuum tube in fluid communication with a vacuum passage. The vacuum passage is defined by an inner surface of the facility plate, the refrigerant flange, and the combined flange.

BRIEF DESCRIPTION OF DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly which enables operation of an electrostatic chuck (ESC) so that a substrate disposed thereon is maintained at a temperature less than −20 degrees Celsius during substrate processing while other surfaces of a processing chamber are maintained at a different temperature.

Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where processing necessitates a substrate maintained at temperatures less than −20 degrees Celsius. The substrate support assembly disclosed herein may also be utilized at temperatures greater than −20 degrees Celsius.

Figure 1:
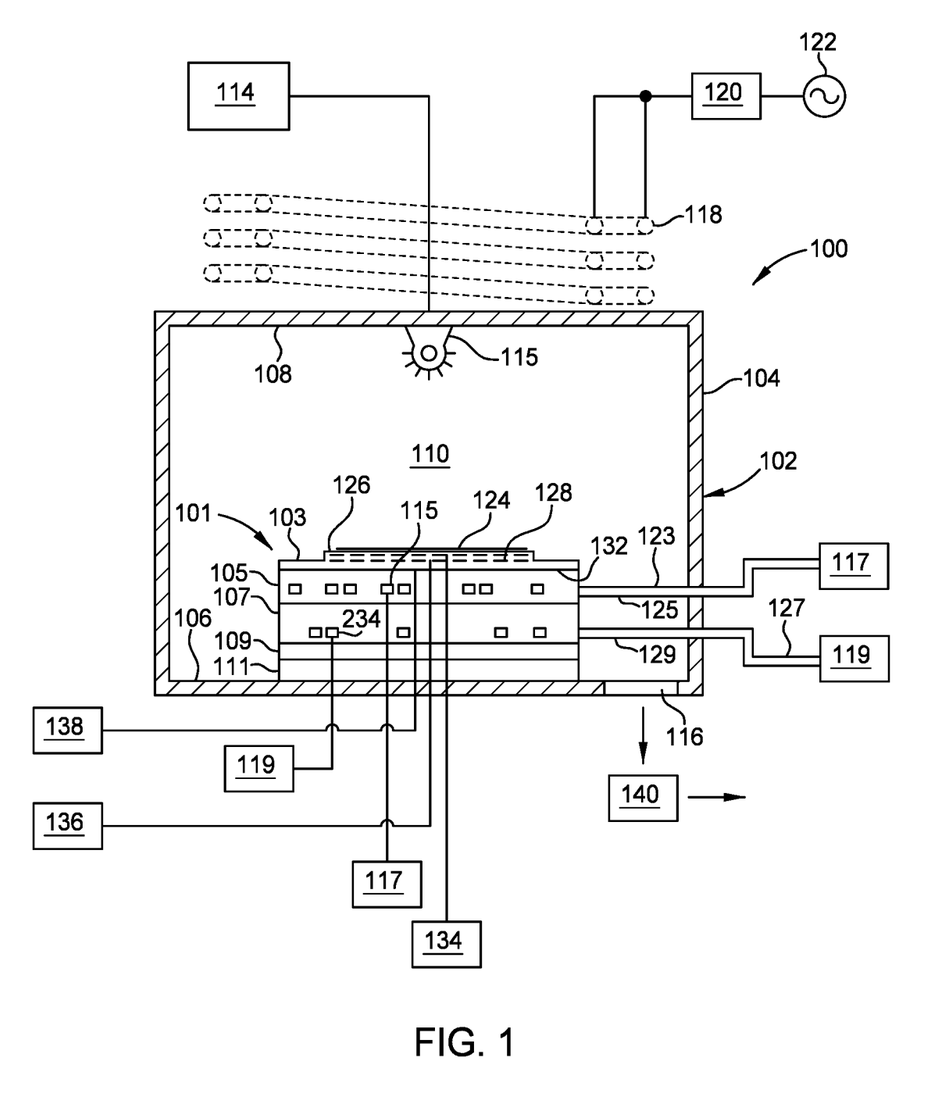
FIG. 1 is a cross-sectional schematic view of a plasma processing chamber, according to embodiments.

FIG. 1 is a cross-sectional schematic view of an exemplary plasma processing chamber 100, shown configured as an etch chamber, having a substrate support assembly 101. The substrate support assembly 101 may be utilized in other types of plasma processing chambers, for example plasma treatment chambers, annealing chambers, physical vapor deposition chambers, chemical vapor deposition chambers, and ion implantation chambers, among others, as well as other systems where the ability to uniformly maintain a surface or workpiece, such as a substrate 124, at temperatures less than −20 degrees Celsius is desirable. Dry reactive ion etching a substrate 124 maintained at temperatures less than −20 degrees Celsius enables ions to bombard the upward facing surfaces of materials disposed on the substrate 124 with decreased spontaneous etching so that trenches with smooth, vertical sidewalls are formed. For example, diffusion of ions in porosities of a low-k dielectric material disposed on the substrate 124 uniformly maintained at temperatures less than −20 degrees Celsius is decreased while ions continue to bombard the upward facing surface of the low-k dielectric material to form trenches with smooth, vertical sidewalls. Additionally, selectivity of etching one material versus another can be improved at temperatures less than −20 degrees Celsius. For example, selectivity between silicon (Si) and silicon dioxide ($SiO_2$) increases exponentially as temperature is decreased.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Process gases, along with any processing by-products, are removed from the processing region 110 through an exhaust port 116 formed in the sidewalls 104 or bottom 106 of the chamber body 102. The exhaust port 116 is coupled to a pumping system 140, which includes throttle valves and pumps utilized to control the vacuum levels within the processing region 110.

The process gases may be energized to form a plasma within the processing region 110. The process gases may be energized by capacitively or inductively coupling RF power to the process gases. In the embodiment, which can be combined with other embodiments described herein, depicted in FIG. 1, a plurality of coils 118 are disposed above the lid 108 of the plasma processing chamber 100 and coupled through a matching circuit 120 to an RF power source 122.

The substrate support assembly 101 is disposed in the processing region 110 below the injection apparatus 112. The substrate support assembly 101 includes an ESC 103 and an ESC base assembly 105. The ESC base assembly 105 is coupled to the ESC 103 and a facility plate 107. The facility plate 107 supported by a ground plate 111 is configured to facilitate electrical, cooling, heating, and gas connections with the substrate support assembly 101. The ground plate 111 is supported by the bottom 106 of the processing chamber. An insulator plate 109 insulates the facility plate 107 from the ground plate 111.

The ESC base assembly 105 includes a base channel 115 coupled to a cryogenic chiller 117. The cryogenic chiller 117 is in fluid communication with the base channel 115 via a base inlet conduit 123 connected to an inlet 254 (shown in FIGS. 2A and 2B) of the base channel 115 and via a base outlet conduit 125 connected to an outlet 256 (shown in FIGS. 2A and 2B) of the base channel 115 such that the ESC base assembly 105 is maintained at temperatures less than −20 degrees Celsius. The cryogenic chiller 117 is coupled to an interface box to control a flow rate of a base fluid. The base fluid may include a material that can maintain a temperature less than −50 degrees Celsius. The cryogenic chiller 117 provides the base fluid, which is circulated through the base channel 115 of the ESC base assembly 105. The base fluid flowing through the base channel 115 enables the ESC base assembly 105 to be maintained at temperatures less than −20 degrees Celsius, which assists in controlling the lateral temperature profile of the ESC 103 so that a substrate 124 disposed on the ESC 103 is uniformly maintained at temperatures less than −20 degrees Celsius. In one embodiment, which can be combined in other embodiments described herein, the cryogenic chiller 117 is a single-stage chiller operable to maintain the base fluid at temperature less than about −50 degrees Celsius. In another embodiment, which can be combined in other embodiments described herein, the cryogenic chiller 117 is a chiller that utilizes refrigerant internal to the chiller such the base fluid is maintained at temperatures less than −50 degrees Celsius.

The facility plate 107 includes a facility channel 234 (shown in FIGS. 2A and 2B) coupled to a chiller 119. The chiller 119 is in fluid communication with the facility channel 234 via a facility inlet conduit 127 connected to an inlet 240 (shown in FIGS. 2A and 2B) of the facility channel 234 and via a facility outlet conduit 129 connected to an outlet 242 (shown in FIGS. 2A and 2B) of the facility channel 234 such that the facility plate 107 is maintained a predetermined ambient temperature. The cryogenic chiller 117 is coupled to an interface box to control a flow rate of the facility fluid. The facility fluid may include a material that can maintain an ambient temperature between about −10 degrees Celsius to about 60 degrees Celsius. The chiller 119 provides the facility fluid, which is circulated through the facility channel 234 of the facility plate 107. The facility fluid flowing through the facility channel 234 enables the facility plate 107 to be maintained at the predetermined ambient temperature, which assists in maintaining the insulator plate 109 at the predetermined ambient temperature.

The ESC 103 has a support surface 130 and a bottom surface 132 opposite the support surface 130. In one embodiment, which can be combined with other embodiments described herein, the ESC 103 is fabricated from a ceramic material, such as alumina (Al$_2$O$_3$), aluminum nitride (AlN) or other suitable material. Alternately, the ESC 103 may be fabricated from a polymer, such as polyimide, polyetheretherketone, polyaryletherketone and the like.

The ESC 103 includes a chucking electrode 126 disposed therein. The chucking electrode 126 may be configured as a mono polar or bipolar electrode, or other suitable arrangement. The chucking electrode 126 is coupled through an RF filter and the facility plate 107 to a chucking power source 134, which provides a DC power to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein. The resistive heaters 128 are utilized to elevate the temperature of the ESC 103 to the temperature suitable for processing a substrate 124 disposed on the support surface 130. The resistive heaters 128 are coupled through the facility plate 107 and an RF filter to a heater power source 136. The RF filter prevents RF power utilized to form a plasma (not shown) within the plasma processing chamber 100 from damaging electrical equipment or presenting an electrical hazard outside the chamber. The heater power source 136 may provide 500 watts or more power to the resistive heaters 128. The heater power source 136 includes a controller (not shown) utilized to control the operation of the heater power source 136, which is generally set to heat the substrate 124 when needed in order to maintain the substrate temperature at a desired temperature under −20 degrees Celsius. Stated differently, heat from the resistive heaters 128 and cooling from the base fluid circulating through the ESC base assembly 105 are balanced to maintain the substrate 124 at a desired temperature under −20 degrees Celsius. For example, the resistive heaters 128 and the base fluid circulating through the ESC base assembly 105 maintain the substrate 124 at a temperature suitable for processing that is less than about −20 degrees Celsius, such as between about −20 degrees Celsius to about −150 degrees Celsius.

The resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones. The separated heating zones of the resistive heaters 128 assist controlling the lateral edge to center temperature uniformity of the substrate 124.

The substrate support assembly 101 may include one or more probes disposed therein. The ESC 103 is coupled a probe controller 138. A probe tip of the probe controller 138 is disposed in or at the surface of the ESC 103 to determine the temperature of the ESC 103. The probe tip of the probe controller 138 is disposed in the ESC base assembly 105 to calibrate of the temperature of the substrate based on the temperature of the ESC base assembly 105. The probe controller 138 is coupled to the heater power source 136 so that each zone of the resistive heaters 128 is independently heated for the lateral temperature profile of the ESC 103 to be substantially uniform based on temperature measurements so that a substrate 124 disposed on the ESC 103 is uniformly maintained at temperatures less than −20 degrees Celsius.

Figure 2A:
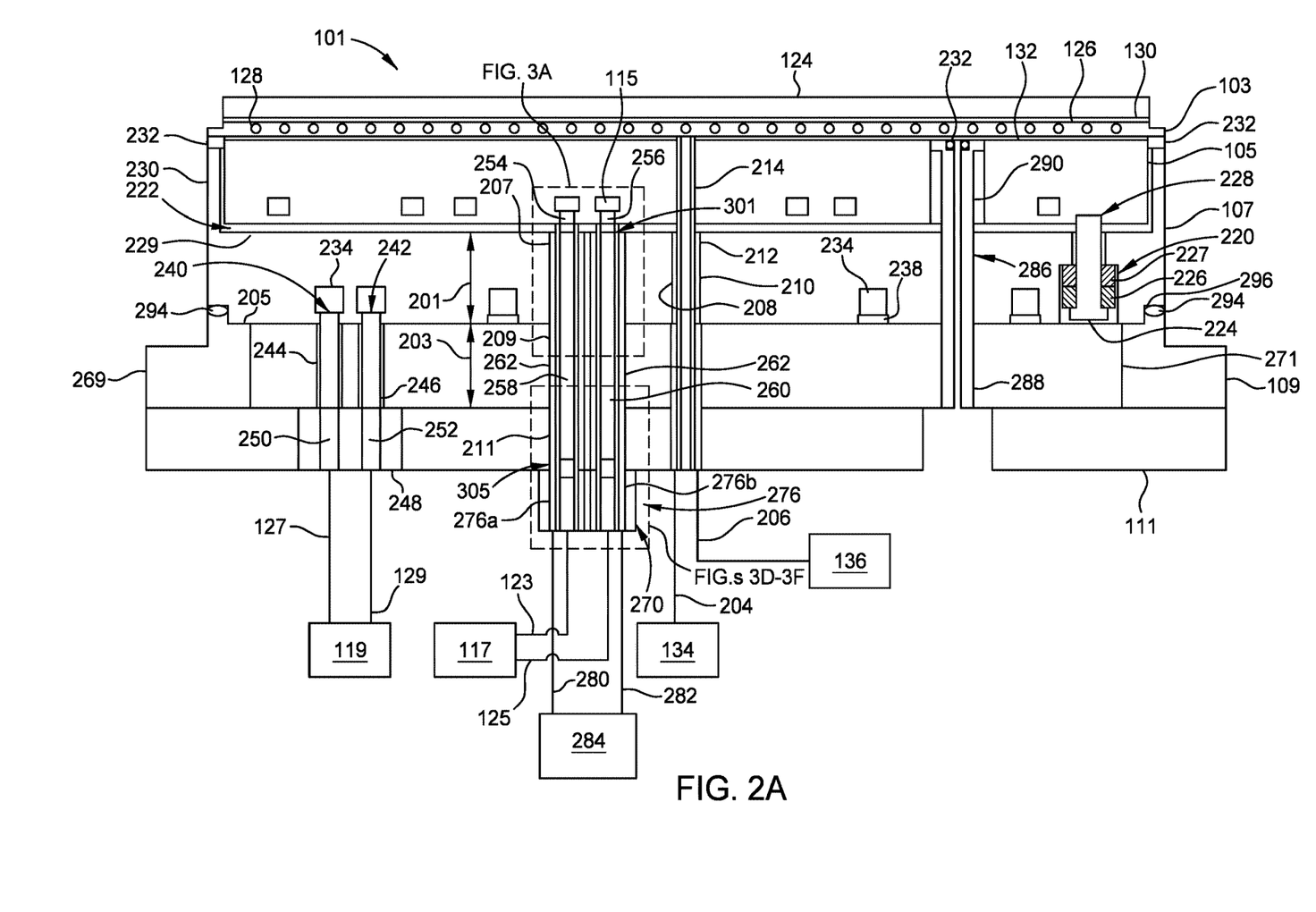
FIGS. 2A and 2B are cross-sectional schematic view of a substrate support assembly, according to embodiments.

FIG. 2A is a cross-sectional schematic view of a substrate support assembly 101 enabling operation of an ESC 103 so that a substrate 124 disposed thereon is maintained at temperatures less than −20 degrees Celsius, while other surfaces of a processing chamber are maintained at a different temperature. The ESC 103 is coupled to the ESC base assembly 105. The ESC 103 is secured to the ESC base assembly 105 with a bonding layer 202. The bonding layer 202 may include organic or inorganic materials. In some embodiments, which may be combined with other embodiments described herein, the bonding layer 202 may include epoxy or metal materials. The chucking electrode 126 is coupled to the chucking power source 134 via a first insulated wire 204 disposed through a first bore 208 in a lower insulator 212 of the facility plate 107 and an upper insulator 214 of the ESC base assembly 105. The one or more resistive heaters 128 are coupled to the heater power source 136 via a second insulated wire 206 disposed through a second bore 210 in the lower insulator 212 of the facility plate 107 and the upper insulator 214 of the ESC base assembly 105.

The facility plate 107 includes a plate portion 229 and wall portion 230. The plate portion 229 of the ESC base assembly 105 is coupled to the facility plate 107 with one or more first screw assemblies 220 so that a vacuum region 222 is present between the ESC base assembly 105 and the facility plate 107. Each of the one or more first screw assemblies 220 includes a bolt 224 inserted through a thermal break 227 contacting the facility plate 107, one or more Belleville washers 226, and facility plate 107, and into a thread hole 228 of ESC base assembly 105. The thermal break 227 is in contact with the facility plate 107 to provide thermal isolation from the ESC base assembly 105 maintained at the base temperature. The thermal break 227 includes a polyamide-imide (PAI) or polyimide (PI) containing material. The one or more Belleville washers 226 and bolt 224 are preloaded such that the facility plate 107 is forced against the ESC base assembly 105.

The facility plate 107 includes a wall portion 230 coupled to the ESC 103 by a seal 232. The lower insulator 212 of the facility plate 107 maintains the vacuum region 222 via the seal 232. The wall coupled to the ESC by the seal 232 protects the materials of the ESC base assembly 105 from potentially flaking off from contact with process gases. The vacuum region 222 is defined by the ESC 103, ESC base assembly 105, facility plate 107, and the seal 232. The vacuum region 222 prevents condensation on the backside of the cooling plate, prevents process gases from entering the substrate support assembly 101 by having a pressure independent of the pressure of the processing region 110, and provides for thermal isolation between the ESC base assembly 105 and facility plate 107. The facility plate 107 includes aluminum containing materials.

The facility channel 234 of the facility plate 107 is machined in the facility plate and welded with a cover 238. The inlet 240 of the facility channel 234 is in fluid communication with an inlet tube 244 disposed through the insulator plate 109 and the ground plate 111. The outlet 242 of the facility channel 234 is in fluid communication with an outlet tube 246 disposed through the insulator plate 109 and the ground plate 111. The inlet tube 244 and outlet tube 246 are connected to a connection 248 having a connection inlet 250 connected to the facility inlet conduit 127 and a connection outlet 252 connected to the facility outlet conduit 129. The connection 248, the inlet tube 244, and the outlet tube 246 may include insulating materials, such as ceramic containing materials. The base channel 115 of the ESC base assembly 105 includes an inlet 254 of the base channel 115 in fluid communication with an inlet passage 258. The inlet passage 258 is disposed through the facility plate 107, the insulator plate 109, and the ground plate 111. The outlet 256 of the base channel 115 is in fluid communication with an outlet passage 260. The outlet passage 260 is disposed through the facility plate 107, the insulator plate 109, and the ground plate 111. A seal assembly 301 may couple the inlet 254 or the outlet 256 of the ESC base assembly 105 to the inlet passage 258 or the outlet passage 260. In one embodiment, which can be combined with other embodiments described herein, the substrate support assembly 101 includes a seal assembly 301 coupled to the inlet 254 of the ESC base assembly 105. In another embodiment, which can be combined with other embodiments described herein, the seal assembly 301 is also coupled to the outlet 256 of the ESC base assembly 105. In yet another embodiment, which can be combined with other embodiments described herein, the substrate support assembly 101 includes one seal assembly 301 coupled to the inlet 254 of the ESC base assembly 105 and another seal assembly 301 coupled to the outlet 256 of the ESC base assembly 105.

An interface block 270 includes two vacuum tubes 276 i.e., a first vacuum tube 276a and a second vacuum tube 276b. The first vacuum tube 276a is connected to the base inlet conduit 123 such that the cryogenic chiller 117 is in fluid communication with the inlet passage 258. The second vacuum tube 276b is connected to the base outlet conduit 125 such that the cryogenic chiller 117 is in fluid communication with the outlet passage 260. The first vacuum tube 276a is connected to a vacuum conduit 280 in fluid communication with a vacuum source 284. The second vacuum tube 278b is connected to a vacuum conduit 282 in fluid communication with the vacuum source 284.

An interface assembly 305 couples one or more vacuum tubes 276 to the ground plate 111 and the insulator tube 328. In one embodiment, which can be combined with other embodiments described herein, the substrate support assembly 101 includes an interface assembly 305 coupling the first vacuum tube 276a to the insulator tube 328 with the inlet passage 258 disposed therein. In another embodiment, which can be combined with other embodiments described herein, the substrate support assembly 101 includes the interface assembly 305 coupling the second vacuum tube 276b to the insulator tube 328 with the outlet passage 260 disposed therein. In yet another embodiment, which can be combined with other embodiments described herein, the substrate support assembly 101 includes one interface assembly 305 coupling the first vacuum tube 276a to the insulator tube 328 with the inlet passage 258 disposed therein and another interface assembly 305 coupling the second vacuum tube 278b to the insulator tube 328 with the outlet passage 260 disposed therein.

The vacuum region 222 is connected to a vacuum passage 262. The vacuum passage 262 is defined by an inner surface 207 of the facility plate 107, an inner surface of the 209 of the insulator plate 109, an inner surface 211 of the ground plate 111, the inlet passage 258, and the outlet passage 260. The vacuum passage 262 is coupled to the vacuum source 284 through the two vacuum tubes 276. Coupling the vacuum source 284 to the vacuum region 222 and the vacuum passage 262 enables a pressure independent of the pressure of the processing region 110 to be maintained in the two vacuum tubes 276.

The substrate support assembly 101 also includes one or more lift pin assemblies 286 for accommodating lift pins (not shown) for elevating the substrate 124 above the support surface 130 of the ESC 103 to facilitate robotic transfer into and out of the plasma processing chamber 100. Each of the one or more lift pin assemblies 286 includes a lift pin guide 288 disposed through the ESC 103, the ESC base assembly 105, the facility plate 107, the insulator plate 109, and the ground plate 111. A portion 290 of the lift pin guide 288 disposed through the ESC base assembly 105 is surrounded by a threaded bushing 292 holding the lift pin guide 288 in position. The lift pin guide 288 is coupled to the ESC 103 by the seal 232 to maintain the chamber vacuum and insulation vacuum separate. The ESC 103 may include one or more gas passages for providing backside heat transfer gas, such as helium, to an interstitial space defined between the substrate 124 and the support surface 130 of the ESC 103. Each of the one or more one or more gas passages is disposed through the ESC 103, the ESC base assembly 105, the facility plate 107, the insulator plate 109, and the ground plate 111. Each of the one or more gas passages is coupled to the ESC 103 by the seal 232 to maintain the pressure in the vacuum region 222.

The facility plate 107 includes a recessed portion 296 and a seal 294 disposed between the insulator plate 109 and the facility plate 107. A surface 205 of the insulator plate 109 coupled to the facility plate 107 is conformal the facility plate 107. The recessed portion 296 and the insulator plate 109 provide for a decreased thickness 201 of the facility plate 107 and an increased thickness 203 of the insulator plate 109. The decreased thickness 201 of the facility plate 107 and the increased thickness 203 of the insulator plate 109 reduces a length of the first insulated wire 204 disposed through the first bore 208 in the lower insulator 212 of the facility plate 107 and the length of the first insulated wire 204 disposed through the insulator plate 109. Reducing the length of the first insulated wire 204 disposed through the first bore 208 decreases arcing potential in the first bore 208 of the RF hot facility plate 107 from voltage provided to the first insulated wire 204 by chucking power source 134. An outer portion 269 of the insulator plate 109 may include materials different than the materials of the inner portion 271 of the insulator plate 109. The outer portion 269 may include aluminum oxide ($AlO_2$) containing materials and the inner portion 271 of the insulator plate 109 may include polystyrene containing materials.

Figure 2B:
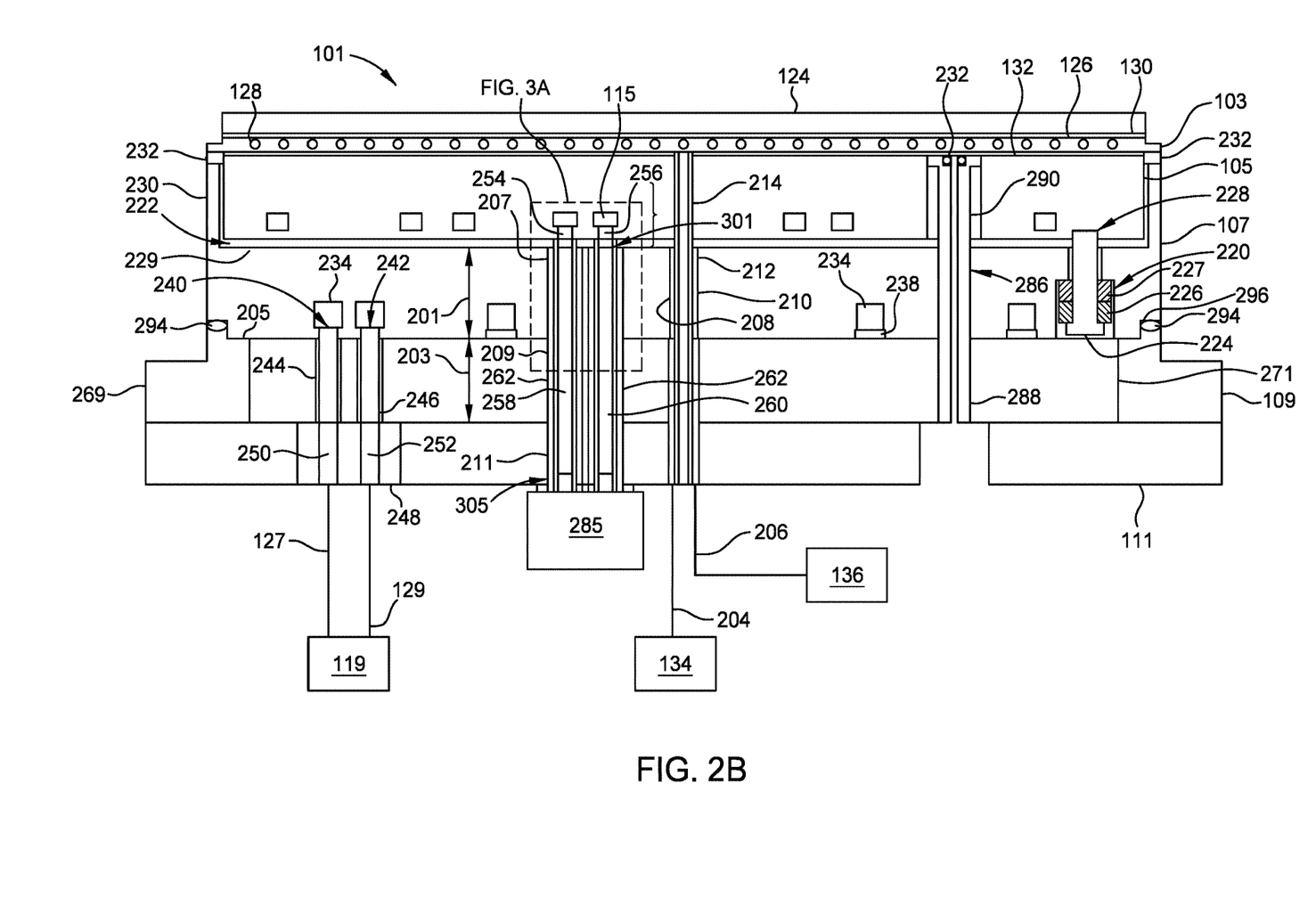

As shown in FIG. 2B, the substrate support assembly 101 includes a protection cover 285. The protection cover 285 is disposed over an interface assembly 305 (shown in FIG. 3E-3G). The protection cover 285 includes insulating material such as polytetrafluoroethylene (PTFE). The protection cover is utilized during packaging, shipping, and transporting of the substrate support assembly 101.

Figure 3A:
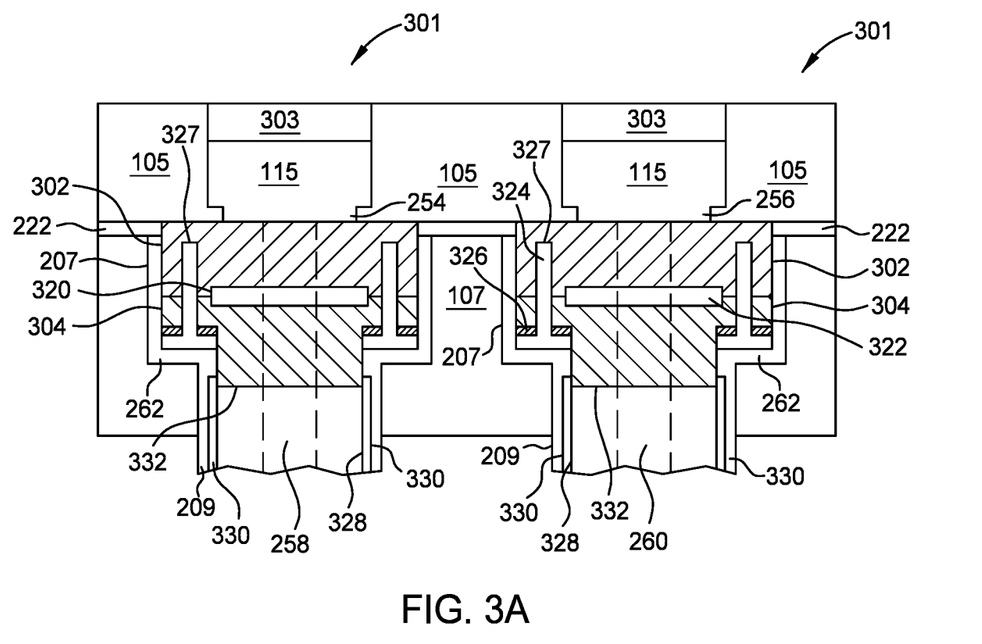
FIG. 3A is a schematic view of a seal assembly, according to embodiments.

FIG. 3A is a schematic cross sectional view of a seal assembly 301. As described above, the seal assembly 301 may be coupled to an inlet 254 or an outlet 256 of the ESC base assembly 105. One seal assembly 301 may be coupled to the inlet 254 of the ESC base assembly 105 and another seal assembly 301 may be coupled to the outlet 256 of the ESC base assembly 105.

The seal assembly 301 includes an upper flange 302. The upper flange 302 is coupled to the ESC base assembly 105. In one embodiment, which can be combined with other embodiments described herein, the upper flange 302 is coupled to the inlet 254 of the ESC base assembly 105. In another embodiment, which can be combined with other embodiments described herein, the upper flange 302 is coupled to the outlet 256 of the ESC base assembly 105. The upper flange 302 is disposed in the facility plate 107. In one embodiment, which can be combined with other embodiments described herein, the upper flange 302 is welded or brazed to the ESC base assembly 105.

The seal assembly 301 includes a lower flange 304. The lower flange 304 is coupled to the upper flange 302. The lower flange 304 is disposed in the facility plate. The lower flange 304 is coupled to the upper flange 302 with a plurality of fasteners 324. The plurality of fasteners 324 may be hex socket screws. The plurality of fasteners 324 are in contact with a plurality of washers 326. The plurality of fasteners 324 are disposed in a plurality of holes 327. The plurality of holes 327 are disposed through the lower flange 304 and the upper flange 302. The plurality of holes 327 may be threaded such that the plurality of fasteners 324 are retained in the plurality of holes 327.

The lower flange 304 includes, but is not limited to one or more of a nickel-cobalt ferrous alloy or a nickel-iron ferrous alloy. The nickel-cobalt ferrous alloy may include one or more of nickel, iron, cobalt, carbon, silicon, and manganese. The nickel-iron ferrous alloy may be FeNi36. Alternatively, the lower flange 304 is formed completely from the nickel-cobalt ferrous alloy, completely from the nickel-iron ferrous alloy, or a combination of the nickel-cobalt ferrous alloy and the nickel-iron ferrous alloy.

The seal assembly 301 includes a gasket 322 disposed between the upper flange 302 and the lower flange 304. The gasket 322 includes, but is not limited to a metallic material. For example, the metallic material is a copper material.

The lower flange 304 is coupled to an insulator tube 128. The insulator tube 328 includes a ceramic material such as a silicon carbide material. For example, the insulator tube 328 is SC-30. The insulator tube 328 provides a feedthrough for the base fluid to enter and exit the ESC base assembly 105 via an inlet passage 258 and an outlet passage 260. In one embodiment, which can be combined with other embodiments described herein, the inlet passage 258 is coupled to the base channel 115 with the seal assembly 301. In another embodiment, which can be combined with other embodiments described herein, the outlet passage 260 is coupled to the base channel 115 with the seal assembly 301. In yet another embodiment, which can be combined with other embodiments described herein, the inlet passage 258 and the outlet passage 260 are coupled to the base channel 115 with two seal assemblies 301.

An insulator 330 surrounds the insulator tube 328. The insulator 330 includes, but is not limited to, an insulating material such as polytetrafluoroethylene (PTFE), polyetheretherketone (PEEK), or a polyimide-based plastic. The insulator 330 provides insulation to the base fluid travelling through the inlet passage 258 and the outlet passage 260. The insulator 330 may include two halves coupled together.

The inlet passage 258 is connected to the inlet 254. The inlet passage 258 is defined by connected openings of the upper flange 302, the gasket 322, the lower flange 304, and the insulator tube 328. The base fluid flows through the connected openings of the upper flange 302, the gasket 322, the lower flange 304, and the insulator tube 328. The outlet passage 260 is connected to the outlet 256. The outlet passage 260 is defined by connected openings of the upper flange 302, the gasket 322, the lower flange 304, and the insulator tube 328. The base fluid flows through the connected openings of the upper flange 302, the gasket 322, the lower flange 304, and the insulator tube 328.

The seal assembly 301 provides a seal such that the inlet passage 258 disposed through the facility plate 107, the insulator plate 109, and the ground plate 111 can provide the base fluid to the base channel 115. The base fluid is provided through the inlet passage 258 to the inlet 254 of the base channel 115. The seal assembly 301 further provides a seal such that the outlet passage 260 disposed through the facility plate 107, the insulator plate 109, and the ground plate 111 can remove the base fluid from the base channel 115. The base fluid is removed through the outlet passage 260 from the outlet 256 of the base channel 115.

Additionally, the seal assembly 301 prevents vacuum leaks in the vacuum region 222 and a vacuum passage 262. The vacuum passage 262 is connected to the vacuum region 222. The vacuum passage 262 is further defined by the inner surface 207 of the facility plate 107, the upper flange 302, the gasket 322, the lower flange 304, and the insulator tube 328.

The seal assembly 301 provides a seal between the ESC base assembly 105 and the facility plate 107. The base channel 115 is machined in the ESC base assembly 105. The base channel 115 may be bonded, welded, or brazed with a cover 303. The seal assembly 301 is operable to retain the base fluid at the base fluid temperatures.

Figure 3B:
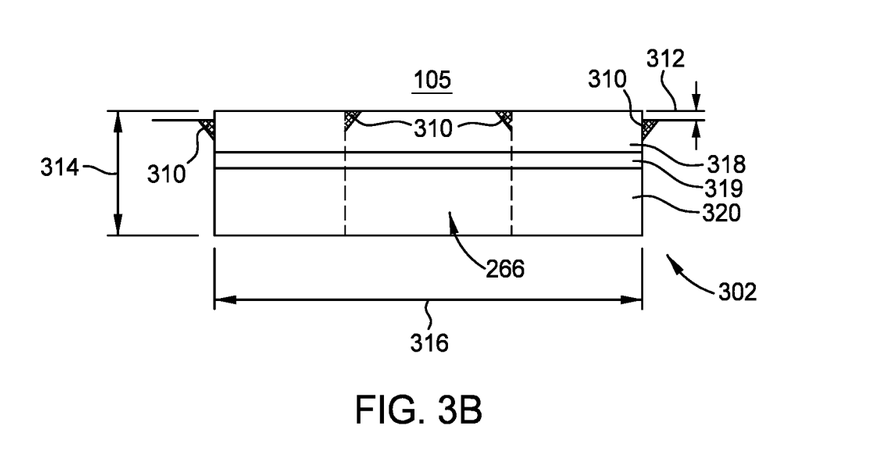
FIG. 3B is a schematic, cross-sectional view of an upper flange, according to embodiments.

FIG. 3B is a schematic, cross-sectional view of an upper flange 302 shown in FIG. 3A. In one embodiment, which can be combined with other embodiments described herein, the upper flange 302 is welded (such as with an explosion welding process) to the ESC base assembly 105 at a plurality of weld points 310. The upper flange 302 may also be brazed to the ESC base assembly 105. The plurality of weld points 310 are between about 0.09 inches and about 0.15 inches. The upper flange 302 is recessed into the ESC base assembly 105 at a recess length 312. The recess length is between about 0.05 inches and about 0.12 inches. The upper flange 302 has an upper flange length 314 between about 0.28 inches and about 0.48 inches. The upper flange 302 has an upper flange width 316 between about 1.33 inches and about 2.12.

As shown in FIG. 3B, the upper flange 302 includes a top portion 318 and a bottom portion 320. The top portion 318 is coupled to the ESC base assembly 105. The bottom portion 320 of the upper flange 302 is in contact with the gasket 322. The top portion 318 includes, but is not limited to, a metal material. In one example, the top portion 318 is an aluminum. In another example, the portion 318 is a stainless steel or a titanium. The bottom portion 320 includes, but is not limited to a metal material. When the top portion 318 is aluminum, the bottom portion is a stainless steel, titanium, or combination thereof. When the top portion 318 is stainless steel or titanium the top portion 318 is coupled to the ESC base assembly 105 by an explosion welding process. In yet another example, the top portion 318 and the bottom portion 320 may both have the same material, such as a metallic material. The bottom portion 320 is coupled to the top portion 318 by a bonding region 319. The bonding region 319 utilizes a welding process such as an explosion welding process to couple the bottom portion 320 to the top portion 318.

Figure 3C:
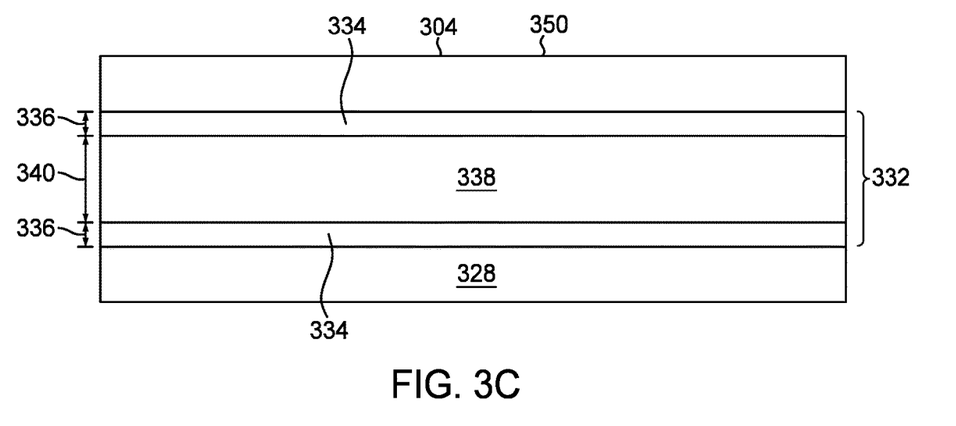
FIGS. 3C and 3D are schematic, cross-sectional views of a plurality of bonding layers, according to embodiments.
Figure 3D:
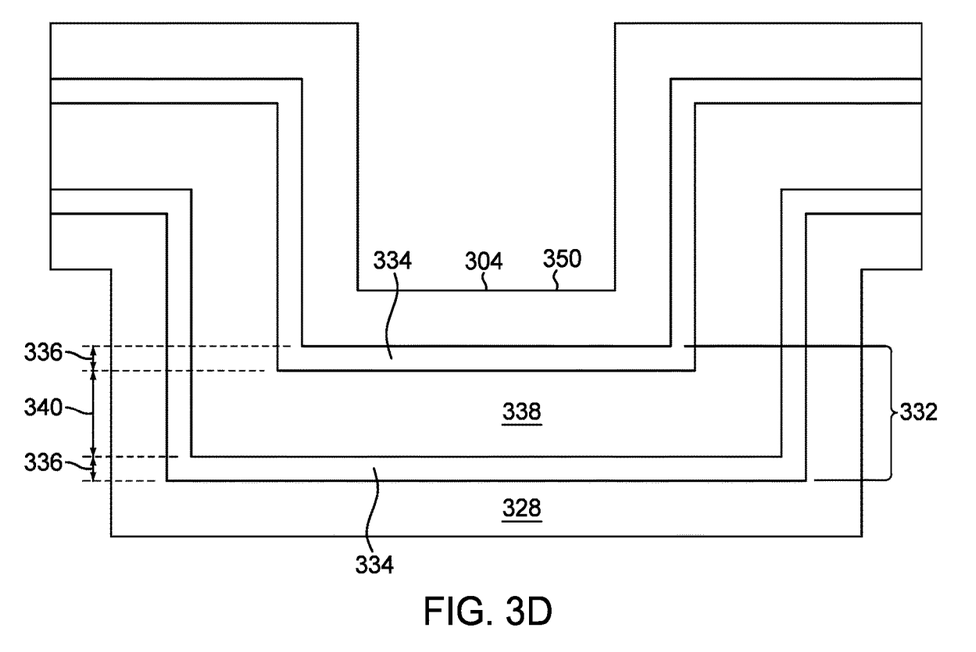

FIG. 3C and FIG. 3D are schematic, cross-sectional views of a plurality of bonding layers 332. The bonding layers may be planar, as shown in FIG. 3C, or stepped, as shown in FIG. 3D. The stepped surfaces may improve part locking and lateral movement due to temperature cycling. The stepped surfaces may also improve bonding surface area and hermetic sealing. The lower flange 304 is coupled to the insulator tube 328 with a plurality of bonding layers 332. The plurality of bonding layers 332 include a plurality of metallization layers 334. The plurality of metallization layers 334 include, but are not limited to, Mo—Mn, or combinations thereof. The plurality of metallization layers 334 include a metallization layer thickness 336 from about 0.0001 inches to about 0.0005 inches. The plurality of metallization layers 334 are bonded together by a solder filler 338. The solder filler 338 includes, but is not limited to, tin, indium, or combinations thereof. For example, the solder filler 338 is a Sn, Ag, and Ti containing alloy. The solder filler 338 has a joining temperature of about 140° C. to about 150° C. The solder filler 338 includes a solder filler thickness 340 from about 0.001 inches to about 0.003 inches. The plurality of bonding layers 332 decrease the stress at the junction between the lower flange 304 to the insulator tube 328.

Figure 3E:
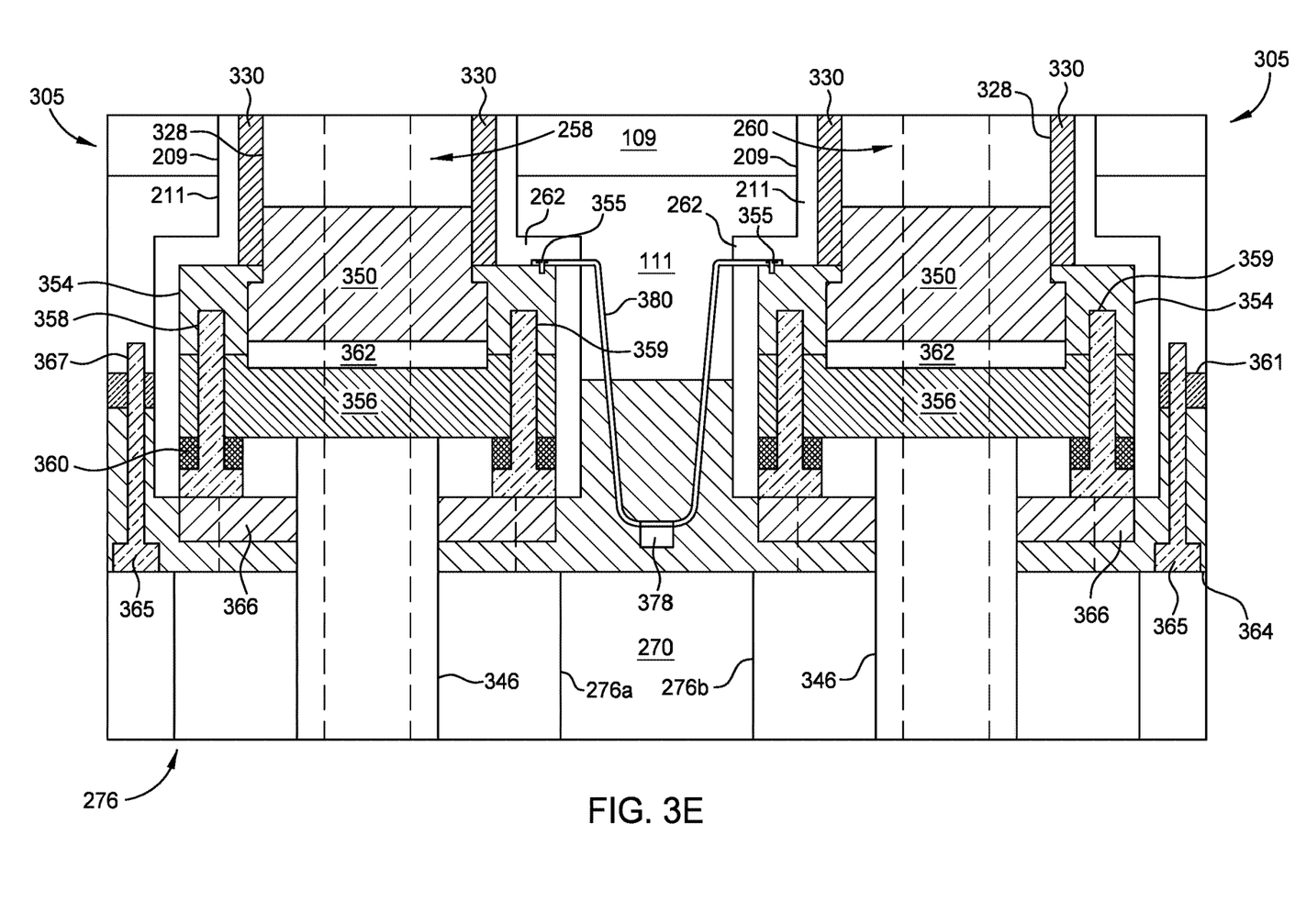
FIGS. 3E-3G are schematic, cross-sectional views of an interface assembly, according to embodiments.
Figure 3F:
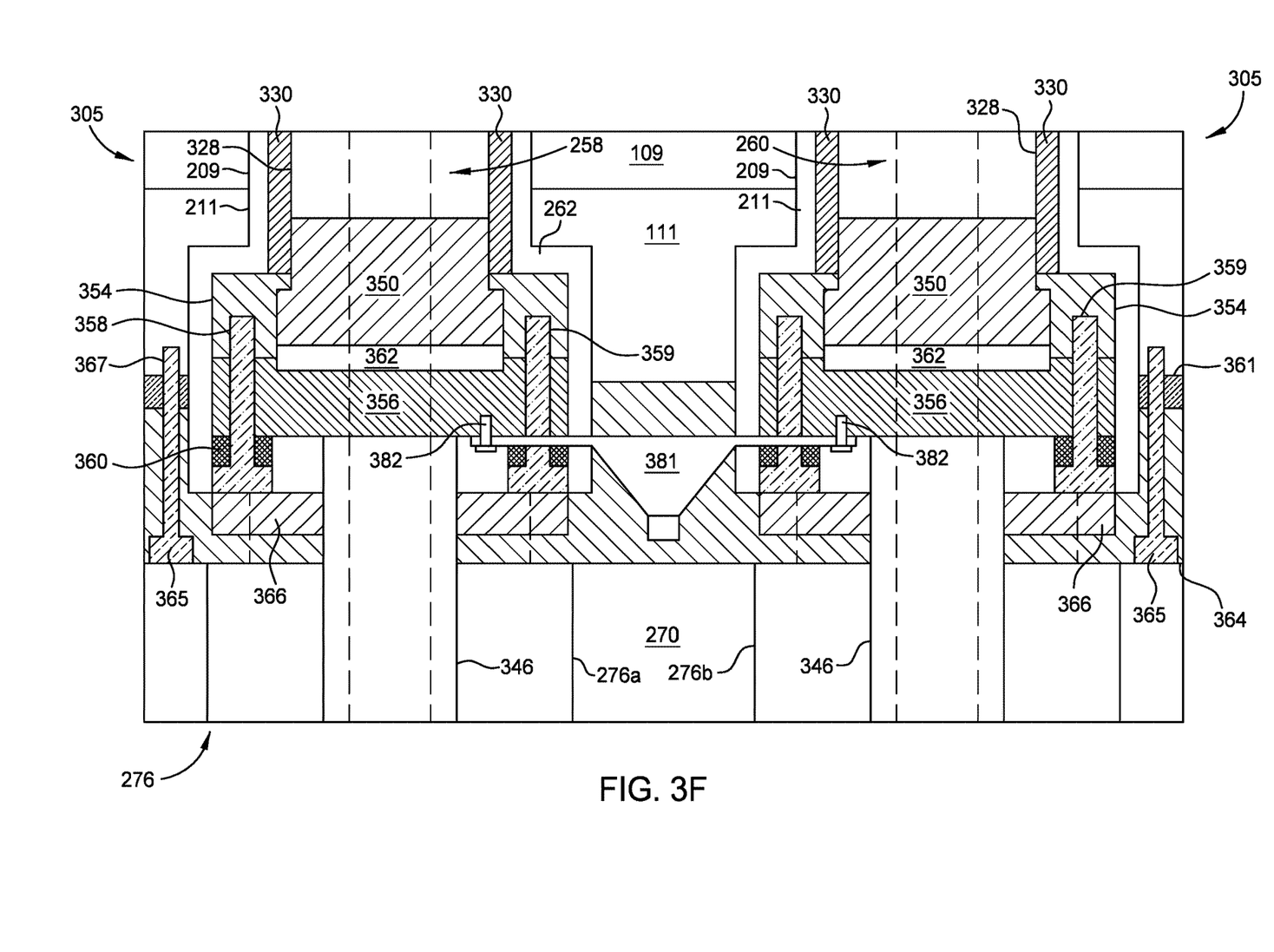
Figure 3G:
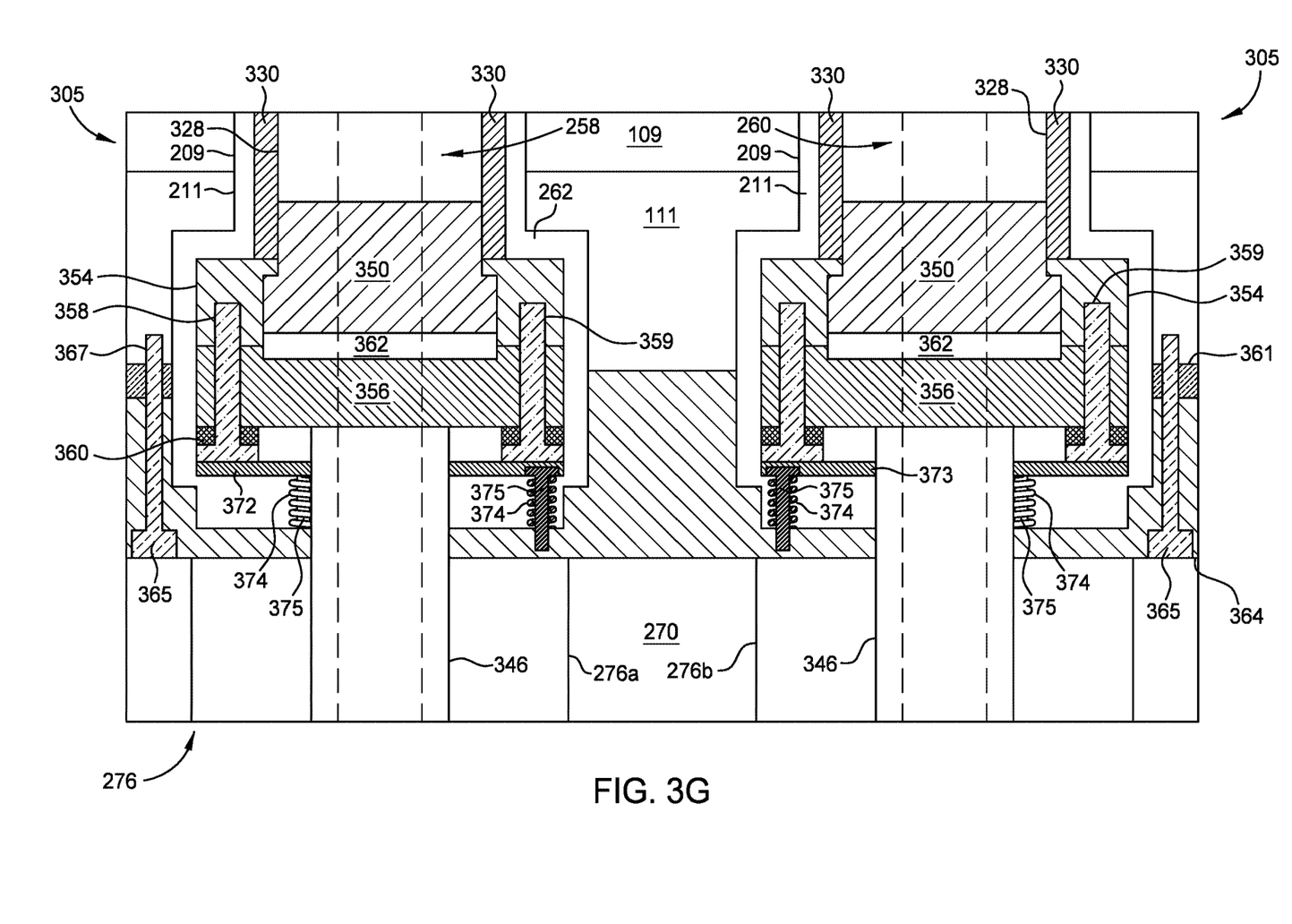

FIGS. 3E-3G are schematic, cross-sectional views of an interface assembly 305. Although two interface assemblies 305 are shown in FIGS. 3E-3G, the substrate support assembly 101 can include one interface assembly 305. The interface assembly 305 couples one of a first vacuum tube 276a, a second vacuum tube 276b, or both a first vacuum tube 276a and a second vacuum tube 276b to the ground plate 111. The interface assembly 305 couples one of a first vacuum tube 276a, a second vacuum tube 276b, or both a first vacuum tube 276a and a second vacuum tube 276b to the insulator tube 128. The one or more vacuum inlet tubes 276 each include a refrigerant line 346 disposed therein. The refrigerant line 346 is in fluid communication with the cryogenic chiller 117. In one embodiment, which can be combined with other embodiments described herein, the refrigerant line 346 supplies the base fluid to the inlet passage 258. In another embodiment, which can be combined with other embodiments described herein, the refrigerant line 346 receives the base fluid from the outlet passage 260. The interface assembly 305 is included in the interface block 270.

In one embodiment, which can be combined with other embodiments described herein, the refrigerant line 346 in fluid communication with the inlet passage 258 is coupled to the ground plate 111 with the interface assembly 305. In another embodiment, which can be combined with other embodiments described herein, the refrigerant line 346 in fluid communication with the outlet passage 260 is coupled to the ground plate 111 with the interface assembly 305. In yet another embodiment, which can be combined with other embodiments described herein, the refrigerant line 346 in fluid communication with the inlet passage 258 and another refrigerant line 346 in fluid communication with the outlet passage 260 are coupled to the ground plate 111 with two interface assemblies 305.

The interface assembly 305 includes an interface flange 350. The interface flange 350 is coupled to the insulator tube 328. The interface flange 350 is disposed in the ground plate 111. As shown in FIG. 3C, the interface flange 350 is coupled to the insulator tube 328 with the plurality of bonding layers 332. The plurality of metallization layers 334 are bonded together by a solder filler 338. The plurality of bonding layers 332 decrease the stress at the junction between the interface flange 350 to the insulator tube 328.

The interface flange 350 includes, but is not limited to one or more of a nickel-cobalt ferrous alloy or a nickel-iron ferrous alloy. The nickel-cobalt ferrous alloy may include one or more of nickel, iron, cobalt, carbon, silicon, and manganese. The nickel-iron ferrous alloy may be FeNi36. The interface flange 350 may be formed completely from the nickel-cobalt ferrous alloy, completely from the nickel-iron ferrous alloy, or a combination of the nickel-cobalt ferrous alloy and the nickel-iron ferrous alloy. The interface flange 350 may be rotatable. The lower flange and the interface flange 350 may consist of the same material, such as the nickel-cobalt ferrous alloy.

The interface assembly 305 includes an outer ring 354. The outer ring 354 is coupled to the interface flange 350. The outer ring 354 includes, but is not limited to, a metallic material. For example, the metallic material can be a stainless steel. The outer ring 354 may include halves coupled together with each other.

The interface assembly 305 includes a refrigerant flange 356. The refrigerant flange 356 is coupled to the interface flange 350. The refrigerant flange 356 provides an interface for the base fluid to enter the insulator tube 328 and/or exit the insulator tube 328. The refrigerant flange 356 is coupled to the interface flange 350 with a plurality of fasteners 358. The plurality of fasteners 358 are disposed through the outer ring 354. The plurality of fasteners are in contact with a plurality of washers 360. The plurality of fasteners 358 are disposed in a plurality of holes 359. The plurality of holes 359 are disposed through the refrigerant flange 356, and the interface flange 350. The plurality of holes 359 may be threaded such that the plurality of fasteners 358 are retained in the plurality of holes 359.

The interface assembly 305 includes an interface gasket 362 disposed between the interface flange 350 and the refrigerant flange 356. The interface gasket 362 includes, but is not limited to a metallic material. For example, the metallic material is a copper material.

In one embodiment, which can be combined with other embodiments described herein, the interface assembly 305 provides an interface such that the inlet passage 258 disposed through the facility plate 107, the insulator plate 109, and the ground plate 111 can provide the base fluid to the base channel 115. The inlet passage 258 is connected to the inlet 254. The inlet passage 258 is further defined by connected openings of the interface flange 350, the refrigerant flange 356, and the interface gasket 362. The base fluid flows through the connected openings of the inlet interface flange 350, the supply flange 356, and the interface gasket 362.

In another embodiment, which can be combined with other embodiments described herein, the interface assembly 305 provides an interface such that the outlet passage 260 disposed through the facility plate 107, the insulator plate 109, and the ground plate 111 can remove the base fluid from the base channel 115. The outlet passage 260 is connected to the outlet 256. The outlet passage 260 is further defined by connected openings of the interface flange 350, the refrigerant flange 356, and the interface gasket 362. The base fluid flows through the connected openings of the interface flange 350, the refrigerant flange 356, and the interface gasket 362.

The interface assembly 305 includes the combined flange 364. The combined flange 364 of the interface assembly 305 couples one of a first vacuum tube 276a, a second vacuum tube 276b, or both a first vacuum tube 276a and a second vacuum tube 276b to the ground plate 111. The refrigerant flange 356 is disposed in the combined flange 364. An interface assembly 305 compresses the refrigerant flange 356 such that the refrigerant line 346 is in fluid communication with the inlet passage 258 and/or compresses the refrigerant flange 356 such that the refrigerant line 346 is in fluid communication with the outlet passage 258. An interface assembly 305 may compresses the refrigerant flange 356 such that the refrigerant line 346 is in fluid communication with the inlet passage 258 and another interface assembly 305 may compresses the refrigerant flange 356 such that the refrigerant line 346 is in fluid communication with the outlet passage 258.

The combined flange 364 is coupled to the ground plate 111 with a plurality of fasteners 365. The plurality of fasteners 365 are may be bolts. The plurality of fasteners 365 may be spring-loaded. The plurality of fasteners 365 are disposed in a plurality of holes 367. The plurality of holes 367 are disposed through the combined flange 364 and the ground plate 111. The plurality of holes 367 may be threaded such that the plurality of fasteners 365 are retained in the plurality of holes 367. The combined flange includes a thermal interface pad 361.

The one or more vacuum tubes 276 are bonded, welded, or brazed to the combined flange 364. The refrigerant line 346 runs through the one or more vacuum tubes 276. The one or more vacuum tubes 276 are connected to the vacuum passage 262. The vacuum passage 262 is further defined by the inner surface 209 of the insulator plate 109, the inner surface 211 of the ground plate 111, the interface flange 350, the outer ring 354, the refrigerant flange 356, and the combined flange 364.

As shown in FIGS. 3E and 3F, the interface assembly 305 includes an insulator ring 366. The insulator ring 366 surrounds the refrigerant line 346. The insulator ring 366 includes, but is not limited to an insulating material such as polytetrafluoroethylene (PTFE). The insulator ring 366 provides insulation to the base fluid. The vacuum passage 262 runs through the insulator ring 366 into the one or more vacuum tubes 276.

As shown in FIG. 3E, an RF gasket 378 is disposed in the combined flange 364. A bracket 380 is coupled to the outer ring 354 of the interface assembly 305 with a plurality of fasteners 355. The bracket 380 is coupled to the outer ring of two interface assemblies 305. The bracket 380 includes, but is not limited to, an aluminum material. The bracket 380 is in contact with the RF gasket 378 to provide RF grounding.

As shown in FIG. 3F, the RF gasket 378 is disposed in the combined flange 364. A bracket 381 is coupled to the refrigerant flange 356 of the interface assembly 305. The bracket 381 is coupled to the refrigerant flange 356 with a plurality of fasteners 382. The bracket 381 is coupled to the refrigerant flange 356 of two interface assemblies 305. The plurality of fasteners 382 are disposed through the refrigerant flange 356 such that the bracket 381 is in contact with the refrigerant flange 356. The bracket 381 includes, but is not limited to, an aluminum material. The bracket 381 is in contact with the RF gasket 378 to provide RF grounding.

As shown in FIG. 3G, a contact ring 372 is in contact with the plurality of fasteners 358. The contact ring 372 includes, but is not limited to, a metallic material. For example, the metallic material can be a stainless steel. The contact ring 372 contacts the plurality of fasteners 358 for RF grounding. The contact ring 372 remains in contact with the plurality of fasteners 358 with a plurality of screws 374 that support the contact ring 372. The plurality of screws 374 may be shoulder screws and include, but are not limited to, a metallic material. For example, the metallic material can be a stainless steel. The plurality of screws 374 couple the contact ring 372 to the combined flange 364. The plurality of screws 374 include a plurality of springs 375. The plurality of springs 375 are stainless steel compression springs wrapped around each screw 274 of the plurality of screws 374. The plurality of springs 375 allow for the contact ring 372 to remain in contact with the plurality of fasteners 358.

Figure 3H:
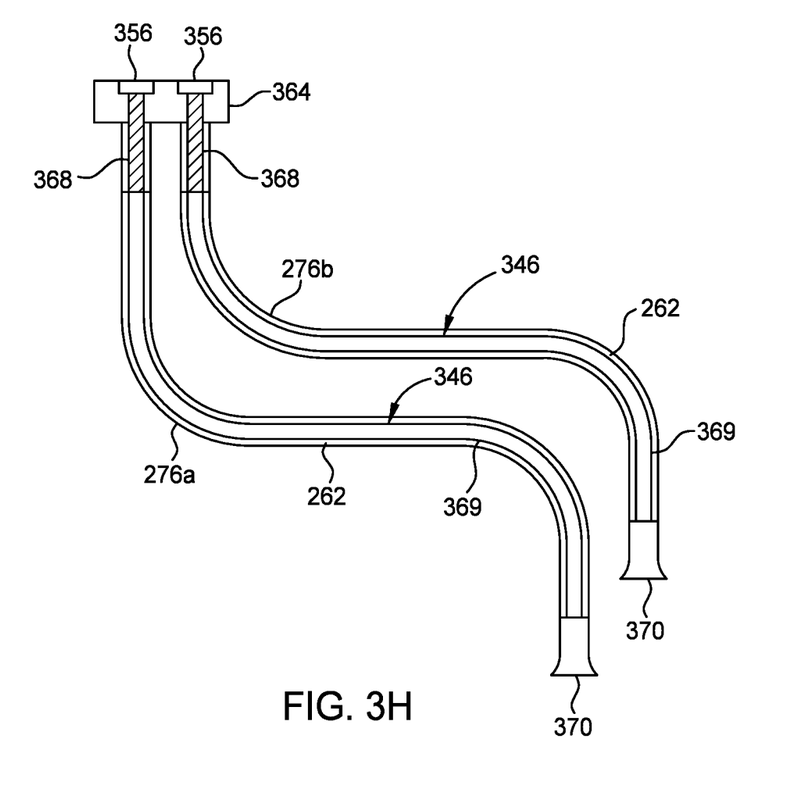
FIG. 3H is a schematic, cross-sectional view of the vacuum inlet tube and the vacuum outlet tube, according to embodiments.

FIG. 3H is a schematic, cross-sectional view of the one or more vacuum tubes 276, i.e., the first vacuum tube 276a and the second vacuum tube 276b. As shown in FIG. 3H, the one or more vacuum tubes 276 are coupled to the combined flange 364. One or more refrigerant lines 346 are coupled to a refrigerant flange 356. One of the one or more refrigerant lines 346 is disposed within the first vacuum tube 276a. One of the one or more refrigerant lines 346 is disposed within the second vacuum tube 276b. The one or more refrigerant lines 346 include a rigid tube 368. Each of the rigid tubes 368 are coupled to the refrigerant flange 356. The one or more refrigerant lines 346 include a flexible portion 369. The one or more vacuum tubes 276 include a vacuum fitting flange 370. The vacuum fitting flange 370 may be coupled to the base inlet conduit 123 or the base outlet conduit 125.

In summation, a substrate support assembly that enables operation of an ESC so that a substrate disposed thereon is maintained at the substrate temperature while other surfaces of a processing chamber are maintained at a different temperature is provided. The substrate support assembly is disposed in the process chamber, including an ESC 103, an ESC base assembly 105 coupled to the ESC 103 and a facility plate 107, and an insulator plate 109 coupled to a ground plate 111. A base fluid flowing through the base channel of the ESC base assembly 105 coupled to the ESC 103 enables the ESC base assembly 105 to be maintained at a base temperature. A seal assembly 301 provides a seal such that the base fluid can pass through an insulator tube 328 to a base channel 115 and travel out of another insulator tube 328. An insulator 330 insulates the base fluid travelling through the insulator tubes 328. The insulator 330 may include a silicon carbide material. An interface assembly 305 couples one or more vacuum tubes 276 to the ground plate 111 with a combined flange 364. A refrigerant flange 356 is disposed in the combined flange 364. A refrigerant line 346 is disposed in each of the one or more vacuum tubes 276.

The substrate support assembly, as described herein, delivers the base fluid to the base channel of the ESC base assembly. The base fluid may include a material that can maintain a base fluid temperature less than −50 degrees Celsius and therefore requires a substrate support assembly that accounts for the large difference in temperatures between the base fluid and various components of the substrate support assembly. Additionally, the substrate support assembly, as described herein, prevents the vacuum region and the vacuum passages from vacuum leakage to provide thermal insulation to the base fluid. As the base fluid travels to the ESC base assembly, the sealing assembly and the interface assembly provide a sealed, insulated environment that both transfers the base fluid to the base channel and protects various surrounding components of the substrate support assembly from the base fluid temperatures.

While the foregoing is directed to examples of the present disclosure, other and further examples of the disclosure may be devised without departing from the basic scope thereof, and the scope thereof is determined by the claims that follow.

What is claimed is:

1. A substrate support assembly, comprising:
   an electrostatic chuck (ESC) base assembly, the ESC base assembly having a base channel disposed therein;
   a facility plate, the facility plate coupled to the ESC base assembly with a vacuum region therebetween;
   a seal assembly, the seal assembly comprising:
      an upper flange coupled to the base channel of the ESC base assembly, the upper flange disposed in the facility plate;
      a lower flange coupled to the upper flange, the lower flange disposed in the facility plate;
      a gasket disposed between the upper flange and the lower flange; and an insulator tube coupled to the lower flange;
a passage connected to the base channel, the passage defined by connected openings of the upper flange, the gasket, the lower flange, the insulator tube, and the base assembly.

2. The substrate support assembly of claim 1, further comprising:
a vacuum passage connected to the vacuum region, wherein the vacuum passage is defined by an inner surface of the facility plate, the upper flange, the gasket, the lower flange, and the insulator tube.

3. The substrate support assembly of claim 2, further comprising:
an insulator plate coupled to the facility plate;
a ground plate coupled to the insulator plate;
an interface assembly, the interface assembly comprising:
an interface flange coupled to the insulator tube, the interface flange disposed in the ground plate;
an outer ring disposed around the interface flange;
a refrigerant flange coupled to the interface flange;
an interface gasket disposed between the interface flange and the refrigerant flange, wherein:
the passage is further defined by connected openings of the interface flange, the refrigerant flange, and the interface gasket; and
a combined flange coupled to the ground plate, the refrigerant flange disposed in the combined flange.

4. The substrate support assembly of claim 3, wherein the vacuum passage is further defined by an inner surface of the insulator plate, an inner surface of the ground plate, the interface flange, the outer ring, the refrigerant flange, and the combined flange.

5. The substrate support assembly of claim 4, further comprising:
a refrigerant line coupled to the refrigerant flange, the refrigerant line in fluid communication with the passage; and
a vacuum tube coupled to the combined flange, the refrigerant line disposed in the vacuum tube, the vacuum passage in fluid communication with the vacuum tube.

6. The substrate support assembly of claim 5, wherein the refrigerant line is in fluid communication with a cryogenic chiller and the vacuum tube is in fluid communication with a vacuum source.

7. The substrate support assembly of claim 3, wherein an insulator ring is disposed in the combined flange.

8. The substrate support assembly of claim 3, wherein the interface flange is coupled to the insulator tube with a plurality of bonding layers.

9. The substrate support assembly of claim 3, wherein the lower flange and the interface flange are the same material.

10. The substrate support assembly of claim 1, wherein the facility plate is coupled to the ESC base assembly with one or more first screw assemblies.

11. The substrate support assembly of claim 1, wherein the upper flange is coupled to the ESC base assembly with a plurality of weld points or the upper flange is brazed to the ESC base assembly.

12. The substrate support assembly of claim 1, wherein the upper flange includes a top portion and a bottom portion, the top portion including an aluminum material, the bottom portion including stainless steel, titanium, or combinations thereof.

13. The substrate support assembly of claim 1, the lower flange is coupled to the upper with a plurality of fasteners.

14. The substrate support assembly of claim 1, wherein the insulator tube is coupled to the lower with a plurality of bonding layers, the plurality of bonding layers including a plurality of metallization layers and a solder filler disposed between the plurality of bonding layers.

15. The substrate support assembly of claim 1, wherein the insulator tube includes silicon carbide.

16. A substrate support assembly, comprising:
an electrostatic chuck (ESC) base assembly, the ESC base assembly having a base channel disposed therein;
a facility plate, the facility plate coupled to the ESC base assembly with a vacuum region therebetween;
an insulator plate coupled to the facility plate;
a ground plate coupled to the insulator plate;
an interface assembly, the interface assembly comprising:
an interface flange coupled to an insulator tube disposed through the insulator plate, the interface flange disposed in the ground plate;
an outer ring disposed around the interface flange;
a refrigerant flange coupled to the interface flange;
an interface gasket disposed between the interface flange and the refrigerant flange, wherein:
a passage connected to the base channel of the ESC base assembly is defined by connected openings of the interface flange, the refrigerant flange, the interface gasket, and the base channel;
a combined flange coupled to the ground plate, the refrigerant flange disposed in the combined flange; and
a vacuum passage connected to the vacuum region, wherein:
the vacuum passage is defined by an inner surface of the facility plate, an inner surface of the insulator plate, an inner surface of the ground plate, the interface flange, the outer ring, the refrigerant flange, the insulator tube, and the combined flange.

17. The substrate support assembly of claim 16, wherein a bracket coupled to an RF gasket and the outer ring provides RF grounding, the bracket coupled to the outer ring with a plurality of fasteners.

18. The substrate support assembly of claim 16, wherein a bracket coupled to an RF gasket and the refrigerant flange provides RF grounding, the bracket coupled to the refrigerant flange with a plurality of fasteners.

19. The substrate support assembly of claim 16, wherein a contact ring is in contact with a plurality of fasteners, the plurality of fasteners coupling the refrigerant flange to the interface flange, the contact ring supported by a plurality of screws disposed through the combined flange, the plurality of screws including a plurality springs disposed around the plurality of screws.

20. A substrate support assembly, comprising:
an electrostatic chuck (ESC) base assembly, the ESC base assembly having a base channel disposed therein;
a facility plate, the facility plate coupled to the ESC base assembly with a vacuum region therebetween;
a refrigerant line coupled to a refrigerant flange disposed in a combined flange, the refrigerant line in fluid communication with a passage, wherein:
the passage is connected to the base channel of the ESC base assembly, the passage defined by connected openings of the refrigerant flange and the base channel; and a vacuum tube coupled to the combined flange, the refrigerant line disposed in the vacuum tube, the vacuum tube in fluid communication with a vacuum passage, wherein:

the vacuum passage is defined by an inner surface of the facility plate, the refrigerant flange, and the combined flange.

\* \* \* \* \*